US006288558B1

(12) United States Patent
Zimmermann et al.

(10) Patent No.: US 6,288,558 B1
(45) Date of Patent: Sep. 11, 2001

(54) METHOD FOR PROBING SEMICONDUCTOR DEVICES FOR ACTIVE MEASURING OF ELECTRICAL CHARACTERISTICS

(75) Inventors: Gunnar Zimmermann, Oberhaching (DE); Mark Johnston, Glen Allen, VA (US)

(73) Assignees: Infineon Technologies AG, Munich (DE); White Oak Semiconductor Partnership, Sandston, VA (US)

(*) Notice: Subject to any disclaimer, the term of this patent is extended or adjusted under 35 U.S.C. 154(b) by 0 days.

(21) Appl. No.: 09/504,409

(22) Filed: Feb. 15, 2000

(51) Int. Cl.[7] .................................................. G01R 31/02
(52) U.S. Cl. ............................................................ 324/754
(58) Field of Search ........................ 204/192.11, 192.13, 204/192.15; 324/754; 257/750, 758; 438/396, 256

(56) References Cited

U.S. PATENT DOCUMENTS

| | | | |
|---|---|---|---|
| 5,930,639 | * 7/1999 | Schuele et al. | 438/396 |
| 5,949,238 | * 9/1999 | Marquis | 324/754 |
| 6,150,718 | * 11/2000 | Livengood et al. | 237/750 |

* cited by examiner

Primary Examiner—Safet Metjahic
Assistant Examiner—E P LeRoux
(74) Attorney, Agent, or Firm—Stanton C. Braden

(57) ABSTRACT

A method for probing a semiconductor component for an active single device test, in accordance with the present invention, includes providing a semiconductor device to be tested and accessing at least one component of the semiconductor device by simultaneously milling a hole and depositing a plug in the hole to connect to the at least one component. A circuit is provided through the plug to make electrical measurements of the semiconductor device.

21 Claims, 5 Drawing Sheets

METHOD FOR PROBING SEMICONDUCTOR DEVICES FOR ACTIVE MEASURING OF ELECTRICAL CHARACTERISTICS

BACKGROUND

1. Technical Field

This disclosure relates to semiconductor testing and more particularly, to a method for measuring electrical characteristics of a single active device on a semiconductor chip.

2. Description of the Related Art

Semiconductor devices are fabricated and tested by employing pattern generators and testers. Also, visual inspections of wafers are employed to determine defects or other abnormalities on the wafers. In some instances, testing is extended to determine failure modes which are experienced in a lot of wafers or on an individual chip. These failure modes determine why or how a failure has occurred. In such instances, it is desirable to focus in detail on the mechanisms which caused failures or on the components which have failed.

In semiconductor memory devices, the characteristics of transfer gates (transistors) in an electrical circuit are among the main parameters, which define the function and performance of semiconductor devices. Usually the design of electrical circuits does not permit an individual probing of a source and drain of a transistor without prior modification of the device. This is especially true in the case of a dense array of memory cells in deep trench (DT) technology. Important information about the characteristics of these cells is mainly based on the performance of specially designed kerf (test) structures (e.g. embedded nominal device). These test structures do not provide information about particular devices themselves, however. It would be beneficial to be able to test a single memory cell in an array of cells for a better understanding of leakage mechanisms and cell performance in an actual device.

Therefore, a need exists for a method for testing individual devices on a semiconductor device.

SUMMARY OF THE INVENTION

A method for probing a semiconductor component for an active single device test, in accordance with the present invention, includes providing a semiconductor device to be tested and accessing at least one component of the semiconductor device by simultaneously milling a hole and depositing a plug in the hole to connect to the at least one component. A circuit is provided through the plug to make electrical measurements of the semiconductor device.

A method for probing a semiconductor component during destructive testing of an active single device includes the steps of providing a semiconductor device to be tested and accessing at least one component of the semiconductor device by milling a hole in a dielectric layer over the component while simultaneously depositing a plug in the hole to electrically connect the at least one component to the plug. A circuit is provided through the plug to make electrical measurements of the semiconductor device, and probe pads are deposited on other components to complete electrical paths for measuring electrical characteristics of the semiconductor device.

Another method for probing a single active memory cell during destructive testing includes the steps of providing a semiconductor device with a memory cell to be tested, accessing a storage node of the memory cell by employing an ion beam to simultaneously mill a hole and deposit a plug in the hole through a dielectric layer, the plug being formed in alignment with the storage node to connect to the storage node and providing a circuit through the plug to make electrical measurements of the semiconductor device by employing the plug to short a wordline to the storage node.

In alternate methods, the step of accessing may include the steps of forming the hole through a dielectric layer covering the at least one component by employing a first portion of an ion beam and depositing platinum in the hole to simultaneously extend the hole into the at least one component and to fill the hole with platinum by employing a second portion of the ion beam. The hole may be less than or equal to about 0.4 microns in diameter. The step of providing a circuit through the plug to make electrical measurements of the semiconductor device may include the step of employing the plug to connect the at least one component to a conductive line existing in a structure of the semiconductor device. The step of measuring electrical characteristics through the plug by probing the conductive line may be included. The step of providing a semiconductor device to be tested may include the step of providing a deep trench capacitor memory cell to be tested. The step of accessing at least one component may include the step of accessing a storage node of the deep trench capacitor. The method may further include the step of measuring electrical characteristics through the plug by probing a contact connected to the wordline. The method may include the step of de-layering the semiconductor device to expose the dielectric layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

Figure 1:
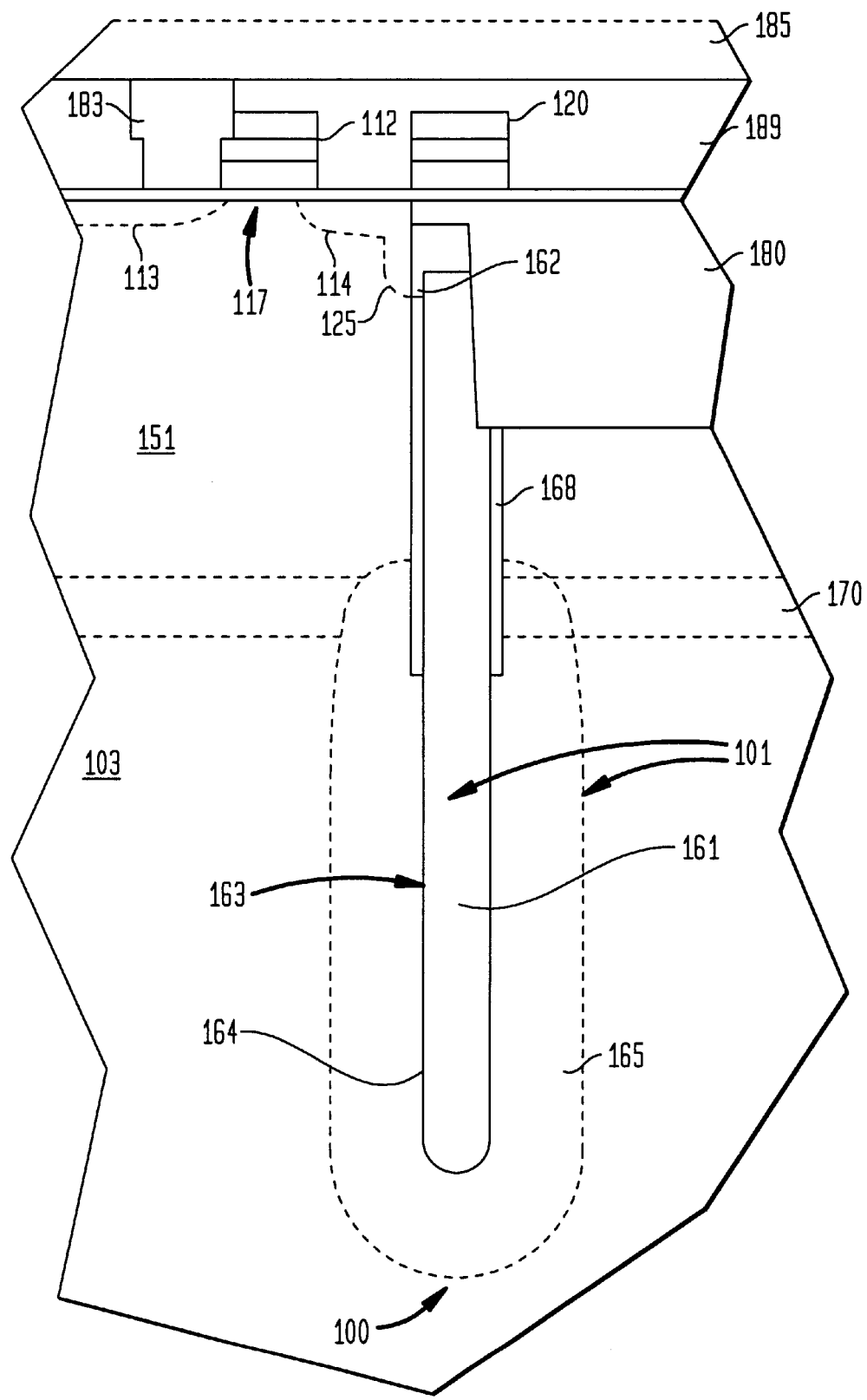
FIG. 1 is a cross-sectional view of a memory cell de-layered in accordance with the present invention.

The present invention relates to methods for measuring electrical characteristics of individual components of semiconductor devices. The present invention provides methods for electrical connection which enable testing of single device components, such as for example transfer gates (transistors), capacitors or other electrical/electronic components employed on a semiconductor device.

Methods of the present invention can make parts of devices accessible for electrical picoprobe-testing after removing upper metal layers to electrically isolate the devices. Subsequent probe pad deposition may be employed to expand probed access on important contacts. In one example, applying these methods to dynamic random access memory (DRAM) cells in deep trench (DT) technology gives access to bitline (BL) and wordline (WL) contacts, as well as P-well (PW) and N-well (buried plate (BP)) contacts after removing all metal layers including the BL.

In conventional techniques, a direct access from a sample's surface to a deep trench capacitor is not possible because a contact (buried strap (BS)) is buried in silicon. This makes the investigation of node-side (i.e., access transistor side) leakage mechanisms like leakage through node dielectric (i.e., dielectric lining the surface of a storage node disposed in a deep trench), gate induced drain leakage (GIDL) or diode leakage of the buried strap (BS) to a P-well diode, extremely difficult if not impossible. It also prevents a direct measurement of the transfer characteristics of the gate.

The present invention provides a method to access components, such as for example, a DT of a single DRAM cell, to overcome these difficulties. A semiconductor wafer or chip is provided in a focused ion beam (FIB) or equivalent tool. Components of the wafer or chip to be tested are exposed by de-layering methods until devices of interest (e.g., single memory cells) are electrically isolated from one another. Components of a device to be tested are now exposed. A needle-like contact (plug) with sufficiently small dimensions is advantageously drilled through dielectric material, for example, silicon-oxide, to make contact with a conductive material. The present invention advantageously provides a simultaneous milling and filling method which provides a drilled hole and an electrical connection (the plug) at the same time. In one illustrative embodiment, a deep trench structure is employed. The electrical connection (the plug) is passed through a passing wordline WL into a target storage node disposed in a DT. A conductive material, such as, platinum (Pt), is deposited as the plug using specially adapted Pt deposition conditions. After deposition, the DT is shorted to the passing WL. The Pt plug has to be isolated from the sample surface (e.g., where the drilled plug enters the dielectric) by depositing a thin layer of highly resistive TEOS or the like, for example, using electron-beam assisted oxide deposition.

BL, active WL, PW and NW are contacted by depositing probe pads on appropriate contacts (e.g., on pre-existing contacts exposed by de-layering). The DT may be connected by depositing a probe pad on a WL-stitch contact or similar contact (e.g., a pre-existing contact which electrically connects to the passing wordline) of a passing WL and can be analyzed in a picoprobe system under various electrical conditions.

The method works reliably for different technologies (e.g. sub-0.25 micron technologies or larger technologies) and advantageously gives direct access for studying the electrical properties of the capacitor-side of single memory cells.

Referring now in specific detail to the drawings in which like reference numerals identify similar or identical elements throughout the several views, and initially to FIG. 1, a cross-sectional view of a deep trench capacitor memory cell 100 is illustratively depicted to demonstrate one embodiment of the present invention; however, the present invention may be practiced on logic devices, memory devices or any other semiconductor device. Deep trench capacitor 101 includes a storage node 161 formed in a deep trench 163. A node dielectric 164 lines the trench 163 and acts as a capacitor dielectric between storage node 161 and buried plate 165. Buried plate 165 includes a doped region surrounding a lower portion of trench 163. A buried N-well 170 and a buried P-well 151 are provided by appropriately doping a substrate 103. P-well 151 is electrically isolated from storage node 161 by a dielectric collar 168. Access to storage node is achieved through a buried strap 162 which includes an outdiffussion region 125 which provides a connection to a drain region 114 of an access transistor 117. Access transistor 117 includes a source region 113. Source region and drain region 113 may be interchanged.

An active wordline 112 functions as a gate to provide an electric field to enable conduction between source 113 and drain 114. A passing wordline 120 passes over deep trench 163 and is isolated from storage node 161 by a shallow trench isolation region 180. A contact 183 passes through a dielectric layer 189 to connect source 113 to a bit line 185 (shown in phantom lines since bitline may be removed by de-layering for the present invention).

The present invention may be employed using one or more testing tools. In one preferred embodiment, a XL 830 dual beam chamber, available commercially from FEI Company is employed to practice the invention. The tool employed is preferably equipped with an ion and an electron gun focused to the same spot as well as gas injectors for gas injection to provide, for example, TEOS, platinum-cyclopentadienyle (Pt) and/or iodine gas injection. For the described tool, the TEOS needle is aligned to the electron beam, all other injectors are aligned to the ion beam. It should be noted that the present invention will be described in terms of materials and processes specific to a focused ion beam tool and/or an electron beam tool; however, other tools and materials may be employed to practice the invention.

For the illustrative embodiment showing a deep trench capacitor structure, device 100 is de-layered down to an MO layer. This may be performed using an etching process which removes metal lines and dielectric layers alike. For example, a 7:1 buffered oxide etch (BOE) and $H_2O_2$ wash may be employed to remove the MO lines leaving behind electrically isolated single cells in the array area. This includes the removal of bit line 185.

Figure 2:
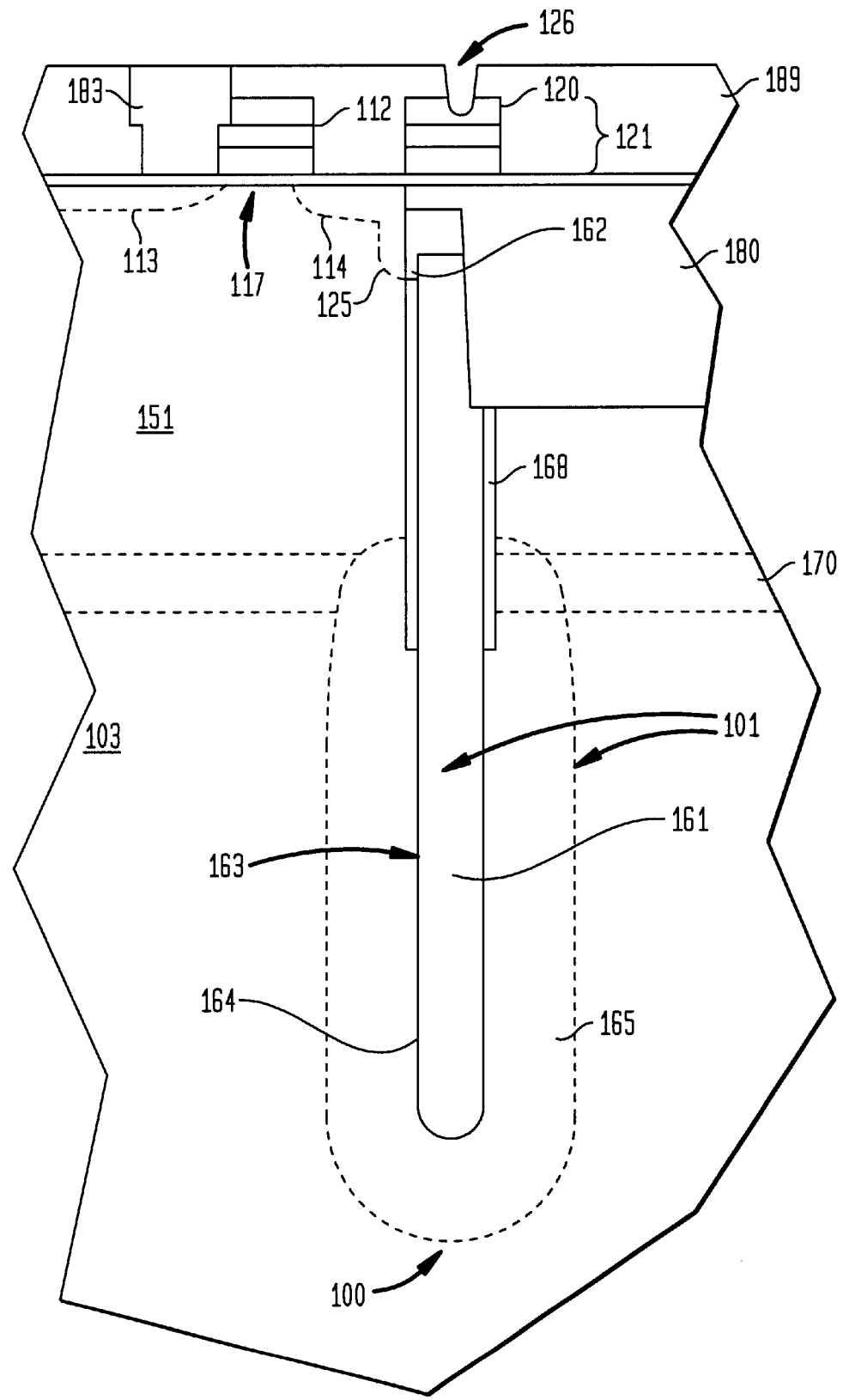
FIG. 2 is a cross-sectional view of the memory cell of FIG. 1 having a hole formed into a gate stack in accordance with the present invention.
Figure 3:
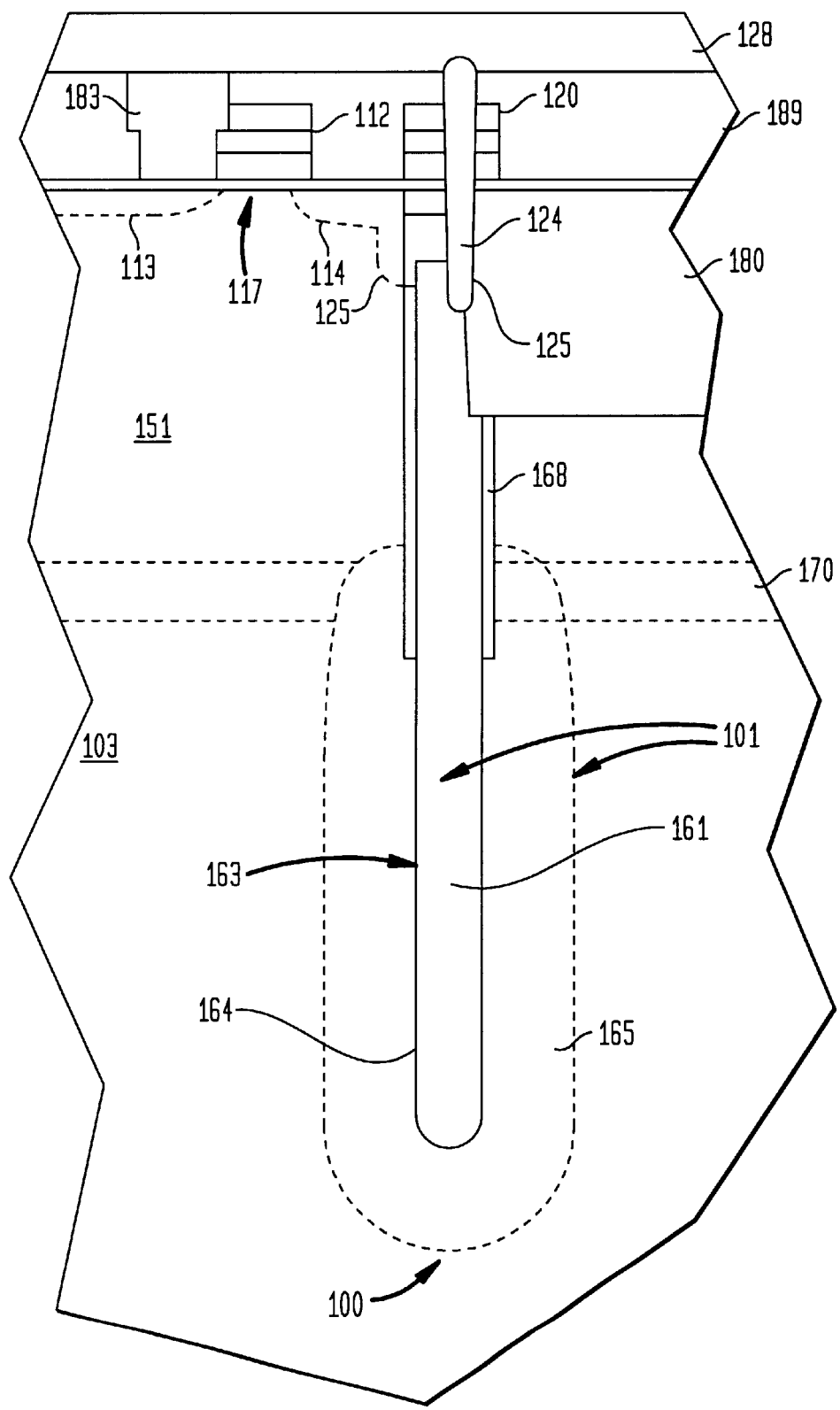
FIG. 3 is a cross-sectional view of the memory cell of FIG. 2 having a plug milled and deposited into the hole for connecting a passing wordline to a storage node in accordance with the present invention.

Referring to FIGS. 2 and 3, to connect storage node 161 in DT 163 to passing WL 120, a small needle-like plug 124 is deposited. Plug 124 includes a highly conductive material such as Pt, although other materials may be employed. Plug 124 is aligned to the center of storage node 161 to avoid shorting to the node dielectric, neighboring wordline 112 or bitline contacts 183 (which may also be formed between active wordline 112 and passing wordline 120). Plug 124 has to stop in storage node 161 shortly after passing through STI oxide 180.

To realize the needle-like plug 124, a procedure was developed by the inventors. FIG. 2 shows a small hole 126 which may optionally be formed by a milling process (e.g., a diameter of the hole may be about 0.15 $\mu$m to about 0.4 $\mu$m). Hole 126 may be milled into dielectric layer 189 (preferably silicon oxide) and through parts of a gate stack 121 of passing WL 120, located directly on top of DT 163. This area later forms the wider upper part of plug 124 where tolerances are more relaxed.

In accordance with a preferred embodiment of the present invention, a hole 125 is formed simultaneously with the formation (deposition) of plug 124. To mill through passing WL 120 and STI-oxide 180 into the DT 163, a special effect discovered by the inventors is preferably employed. When depositing Pt in very small areas (e.g., diameter about 0.15 μm), it appears that during the first seconds a combined milling and deposition process takes place, which is mainly dependent on the beam density. Plug 124 is deposited by employing a focused ion beam including Pt. By adjusting beam current and exposed area the inventors are able to mill through layers into storage node 161 of DT 163 by automatically forming a needle-like hole that is simultaneously (or subsequently) filled with Pt.

The milling/depositing method of the present invention is provided by an ion beam. The ion beam includes a current density distribution, for example, a Guassian distribution, although other distributions are contemplated. By adjusting the current density of the beam, portions of the distribution provide a milling effect (portions of the beam above a current density threshold value) while other portions of the beam (with a current density below a threshold value) provide for deposition. In one example, a threshold value may include a current density of about 2 a.u. In small areas, for example, areas about 0.1 to about 0.25 square microns, the milling and depositing provides for the formation of plug 124. In one embodiment, plug 124 may reach a depth of 1 micron or beyond into, for example, a buried strap or storage node of a deep trench. Plug 124 may also include a diameter of less than 180 nm. By employing an ion beam including a metal, such as Pt, a conductive plug 124 is formed in a simultaneously formed hole 125.

This milling/depositing procedure also provides a shorting of storage node 161 to passing WL 120 where the signal can be easily extracted by depositing a probe pad on a WL stitch contact (not shown) of passing WL 120. WL stitch contact is a contact externally accessible to make a probe connection.

Plug 124 is isolated to the surface by depositing a thin layer 128 of highly insulating TEOS or equivalent using, for example an E-beam of a scanning electron microscope or an XL 830, as described above.

Figure 4:
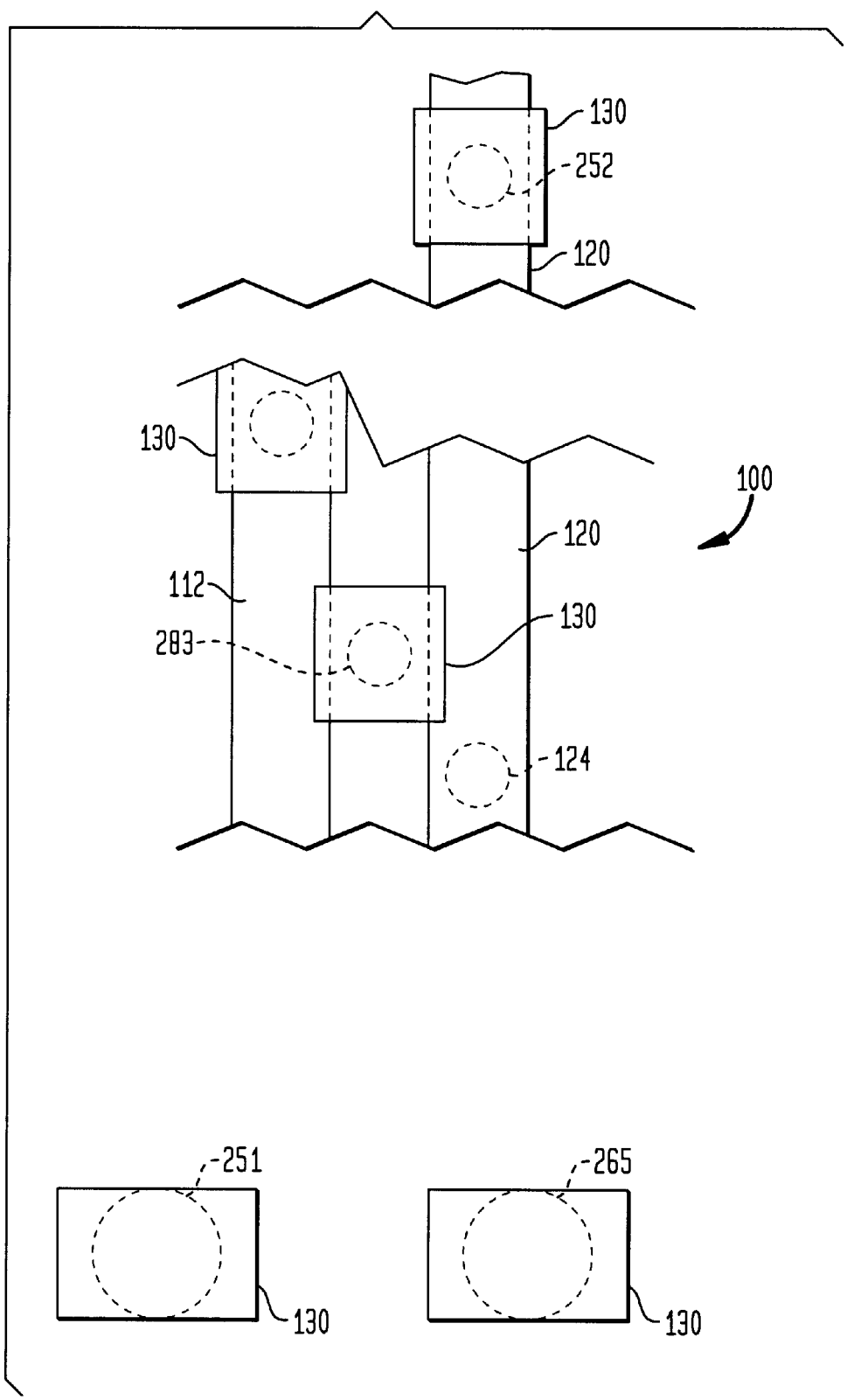
FIG. 4 is a top view of the de-layered memory cell of FIG. 3 showing probe pads for connecting to different components of the memory cell in accordance with the present invention.

Referring to FIG. 4, probe pads 130 may be formed by metal depositions on de-layered contacts. For example, probe pads 130 may be formed to electrically connect and probe deep trench capacitor single cells by depositing probe pads 130 on buried plate contacts 265, WL-stitch contact 252, N-Well or P-Well contacts 251, bitline contact 283, as well as active and passive WLs 112 and 120, respectively. Probe pads 130 may be formed by employing a focused ion beam (FIB) deposition process.

Figure 5:
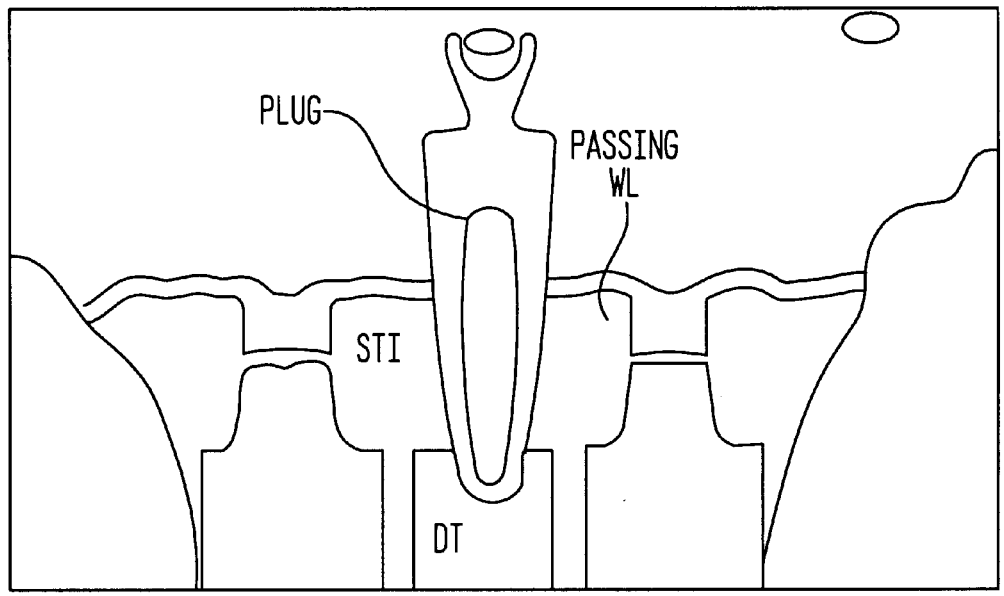
FIG. 5 is a cross-section taken parallel to a passing wordline showing a plug connecting to the passing wordline and a storage node in accordance with the present invention.
Figure 6:
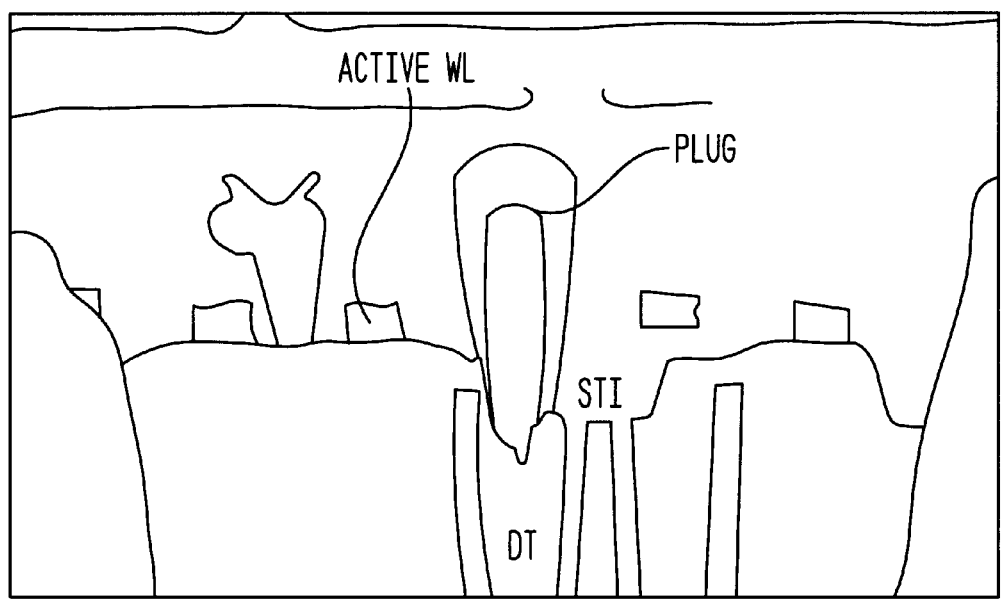
FIG. 6 is a cross-section taken perpendicular to a passing wordline and an active wordline showing the plug connecting to the storage node in accordance with the present invention.

Referring to FIGS. 5 and 6, FIB cross-sections of a DRAM sample in 0.19 μm technology are shown parallel (FIG. 5) and perpendicular (FIG. 6) to the active and passing WLs where the storage node (labeled DT) had been connected using the above described procedure. FIG. 5 shows the efficient shorting of the plug to the passing WL. FIG. 6 reveals the importance of a needle-like plug contact with acceptable tolerances for proper alignment. The plug is milled during deposition although the plug may be deposited after milling a hole.

In accordance with the illustrative example of the present invention, electrical characteristics may be measured on a single memory cell in an array of memory cells. Electrical characteristics which may now be measured include but are not limited to currents through bitlines, wordlines, p-wells, deep trenches, gate oxide leakage, direct measurement of threshold voltages, etc.

The present invention finds utility in a wide range of examinations at the single cell level. For example, different WL and BL voltages may be applied to a single active cell in, for example, 0.2 μm technology, to measure a plurality of electrical characteristics in real time. The present invention is applicable to smaller or larger technologies as well, including sub-0.2 μm technologies. The method has already been successfully used to localize the leakage path of single cells, which failed for node dielectric leakage.

It is to be understood that although the present invention has been described in terms of a deep trench capacitor cell, the present invention is much broader and may be applied to a plurality of different semiconductor structures including memory cells, logic gates, transistors, capacitors or other semiconductor components for processors, memory devices and/or application specific devices.

Having described preferred embodiments for a method for contacting a deep trench capacitor of a memory cell for measuring electrical characterizations of a transfer gate (which are intended to be illustrative and not limiting), it is noted that modifications and variations can be made in the particular embodiments of the invention disclosed which are within the scope and spirit of the invention as outlined by the appended claims. Having thus described the invention with the details and particularly required by the patent laws, what is claimed and desired protected by letters patent is set forth in the appended claims.

What is claimed is:

1. A method for probing a semiconductor component for an active single device test comprising the steps of:
   providing a semiconductor device to be tested;
   accessing at least one component of the semiconductor device by simultaneously milling a hole and depositing a plug in the hole to connect to the at least one component; and
   providing a circuit through the plug to make electrical measurements of the semiconductor device.

2. The method as recited in claim 1, wherein the step of accessing includes the steps of:
   forming the hole through a dielectric layer covering the at least one component by employing a first portion of an ion beam; and
   depositing platinum in the hole to simultaneously extend the hole into the at least one component and to fill the hole with platinum by employing a second portion of the ion beam.

3. The method as recited in claim 1, wherein the hole is less than or equal to about 0.4 microns in diameter.

4. The method as recited in claim 1, wherein the step of providing a circuit through the plug to make electrical measurements of the semiconductor device includes the step of:
   employing the plug to connect the at least one component to a conductive line existing in a structure of the semiconductor device.

5. The method as recited in claim 4, further comprising the step of measuring electrical characteristics through the plug by probing the conductive line.

6. The method as recited in claim 1, wherein the step of providing a semiconductor device to be tested includes the step of providing a deep trench capacitor memory cell to be tested.

7. The method as recited in claim 6, wherein the step of accessing at least one component includes the step of accessing a storage node of the deep trench capacitor.

8. A method for probing a semiconductor component during destructive testing of an active single device comprising the steps of:

provided a semiconductor device to be tested;

accessing at least one component of the semiconductor device by milling a hole in a dielectric layer over the component while simultaneously depositing a plug in the hole to electrically connect the at least one component to the plug;

providing a circuit through the plug to make electrical measurements of the semiconductor device; and depositing probe pads on other components to complete electrical paths for measuring electrical characteristics of the semiconductor device.

9. The method as recited in claim 8, wherein the step of accessing includes the steps of:

forming the hole through the dielectric layer covering the at least one component by employing a first portion of an ion beam; and depositing platinum in the hole to simultaneously extend the hole into the at least one component and to fill the hole with platinum by employing a second portion of the ion beam.

10. The method as recited in claim 8, wherein the step of providing a circuit through the plug to make electrical measurements of the semiconductor device includes the step of:

employing the plug to connect the at least one component to a conductive line existing in a structure of the semiconductor device.

11. The method as recited in claim 10, further comprising the step of measuring electrical characteristics through the plug by probing the conductive line.

12. The method as recited in claim 8, wherein the step of providing a semiconductor device to be tested includes the step of providing a deep trench capacitor memory cell to be tested.

13. The method as recited in claim 12, wherein the step of accessing at least one component includes the step of accessing a storage node of the deep trench capacitor.

14. The method as recited in claim 8, wherein the step of providing a circuit through the plug to make electrical measurements of the semiconductor device includes the step of:

forming probe contacts by employing an ion beam to form contacts on the semiconductor device.

15. The method as recited in claim 14, wherein the circuit for making electrical measurements includes the probe contacts and the plug.

16. A method for probing a single active memory cell during destructive testing comprising the steps of:

providing a semiconductor device with a memory cell to be tested;

accessing a storage node of the memory cell by employing an ion beam to simultaneously mill a hole and deposit a plug in the hole through a dielectric layer, the plug being formed in alignment with the storage node to connect to the storage node; and providing a circuit through the plug to make electrical measurements of the semiconductor device by employing the plug to short a wordline to the storage node.

17. The method as recited in claim 16, wherein the step of accessing includes the steps of:

forming the hole through the dielectric layer covering the storage node by employing a first portion of the ion beam; and depositing platinum in the hole to simultaneously extend the hole into the storage node and to fill the hole with platinum by employing a second portion of the ion beam.

18. The method as recited in claim 16, further comprising the step of measuring electrical characteristics through the plug by probing a contact connected to the wordline.

19. The method as recited in claim 16, further comprising the step of delayering the semiconductor device to expose the dielectric layer.

20. The method as recited in claim 16, wherein the step of providing a circuit through the plug includes the step of:

forming probe contacts connecting to components of the semiconductor device.

21. The method as recited in claim 20, wherein the circuit for making electrical measurements includes the probe contacts and the plug.

* * * * *